United States Patent [19]

Demler et al.

[11] Patent Number: 5,262,685
[45] Date of Patent: Nov. 16, 1993

[54] HIGH-SPEED, LOW POWER AUTO-ZEROED SAMPLING CIRCUIT

[75] Inventors: Michael J. Demler, Mansfield; Kevin J. McCall, Leominster, both of Mass.

[73] Assignee: Unitrode Corporation, Billerica, Mass.

[21] Appl. No.: 778,350

[22] Filed: Oct. 16, 1991

[51] Int. Cl.$^5$ .................. H03K 5/24; G11C 27/02
[52] U.S. Cl. .................. 307/353; 307/355; 307/362; 307/491
[58] Field of Search ............ 307/352, 353, 355, 362, 307/356, 491, 494, 530

[56] References Cited

U.S. PATENT DOCUMENTS

| 4,316,105 | 2/1982 | Fowler | 307/362 |
| 4,553,052 | 11/1985 | Takahashi | 307/352 |
| 4,827,161 | 5/1989 | Kunitoki et al. | 307/362 |

FOREIGN PATENT DOCUMENTS

| 0128818 | 7/1984 | Japan | 307/355 |
| 0084110 | 4/1986 | Japan | 307/362 |

OTHER PUBLICATIONS

Brooktree data sheet Bt251, entitled "15 MSPS Monolithic CMOS Single Channel 8-Bit Image Digitizer", Brooktree Corporation, 9950 Barnes Canyon Road, San Diego, Calif. 92121 consisting of pp. 1–20, 1989.

Primary Examiner—John Zazworsky
Attorney, Agent, or Firm—Weingarten, Schurgin, Gagnebin & Hayes

[57] ABSTRACT

Auto-zeroing clocking signals, a first auto-zeroing clocking signal of comparatively-low frequency and duty cycle and a second auto-zeroing clocking signal of the same comparatively-low frequency but complementary and comparatively-high duty cycle, and a sampling clocking signal of comparatively-high frequency respectively initiate auto-zeroing of a circuit element subject to output offset error and data sampling of an A.C. input signal to a latch. The sampling of the A.C. input signal to the latch occurs at the comparatively-high frequency of the clocking signal during the "on" time of the comparatively-high duty cycle second auto-zeroing clocking signal of comparatively-low frequency enabling thereby to provide higher speed sampling than heretofore possible. The auto-zeroing of the circuit element subject to input offset error occurs during the "on" time of the comparatively-low duty cycle first auto-zeroing clocking signal of comparatively-low frequency enabling thereby to provide lower power sampling than heretofore possible. Typically, the circuit element is either an analog comparator or an operational amplifier, and the sampling circuit of the invention has exemplary utility in analog-to-digital (A/D) conversion.

14 Claims, 1 Drawing Sheet

HIGH-SPEED, LOW POWER AUTO-ZEROED SAMPLING CIRCUIT

FIELD OF THE INVENTION

This invention is directed to the field of electrical interconnection circuits, and more particularly, to a novel high-speed, low-power auto-zeroed sampling circuit especially for analog to digital convertors.

BACKGROUND OF THE INVENTION

Ideally, when either a comparator or an operational amplifier (op-amp) has zero volts differential voltage at its inputs it should not produce an amplified signal at its output. In an amplifier, the output should be exactly zero volts, and in a comparator, the output voltage should represent an indeterminate state between its binary logic levels of "zero" and "one". In practicable embodiments, however, sources of error inherent in such devices actually produce an amplified output, which is referred to as the "output offset voltage". The equivalent input voltage which would produce such an output is referred to as the "input offset voltage". Auto-zeroing techniques, used to cancel offset error voltages in comparators and operational amplifiers, are typically implemented as feedback loops around the amplifier and/or comparator that subtract the input offset voltage from the amplifier and/or comparator input voltage.

An implementation of the auto-zeroing technique which is frequently used in analog/digital (A/D) converters fabricated by CMOS processes includes complementary analog switches that are alternately switched on parallel circuit legs by phase-opposed and non-overlapping clocking signals to charge an input capacitor in series therewith repetitively alternatively to the potential of a reference D.C. voltage applied to one of the switches in a D.C. input signal path and to the potential of an input A.C. signal to be A/D converted applied to the other one of the switches in an A.C. input signal path. A single-input, single-output analog inverter, capacitively coupled by the input capacitor to the D.C. reference voltage and to the input A.C. signal via the switches in the D.C. and A.C. signal paths, has an analog switch in a feedback loop between its output and its input that is switched by the same clocking signal that controls the switch that applies the reference D.C. voltage to the input capacitor. The output is coupled to the "D" terminal of a latch, which latch is again clocked by the same clocking signal that applies the reference D.C. voltage to the input capacitor. During auto-zeroing, feedback is applied to one terminal of the input capacitor by the switch in the feedback loop while the other terminal is charged to the reference D.C. voltage by the switch in the D.C. input signal path. Simultaneous to the auto-zeroing, the result of the previous comparison is stored in the latch, which has its "D" input held on the rising edge of the same clocking signal.

The utility of the heretofore known auto-zeroing technique used in analog/digital converters fabricated in CMOS processes is limited both with respect to the speed with which the sampling of the reference D.C. voltage and the input A.C. signals may be accomplished and with respect to the power that is dissipated by the analog inverter (comparator) in the auto-zeroing mode.

The speed is limited on the one hand by the time constant of the input capacitor as it is cyclically caused to sample the reference D.C. voltage and the input A.C. signal alternately applied thereto by the complementary analog switches that are switched in non-overlapping phase-opposition in the D.C. and A.C. input signal paths. Since each latched result requires a sample both of the reference D.C. voltage and of the input A.C. signal on the input capacitor, sufficient time must be allowed to elapse to enable the input capacitor to charge-up during each sampling interval.

The speed is limited on the other hand by transients that are induced on the input capacitor as it is caused to alternately sample the D.C. reference voltage and the A.C. input signal cycle-to-cycle. As charge is supplied to the input capacitor by the input voltage sources sampled at the clock rate, the input voltage sources, which include signal generators and associated impedances, attempt to change their voltage amplitude as soon as the phase-opposed non-overlapping clocking signals turn the several switches "on" and "off" at the clocking rate. Transients are thereby produced which can corrupt the signals being sampled as well as increase the overall noise levels, which transients consequently must be allowed to die-out cycle-to-cycle, placing thereby another limit on the overall achievable speed of the A/D process.

The principal portion of the power is consumed by the analog inverter in its "on" state. Because the analog inverter is switched "on" cycle-to-cycle at the clocking rate, the heretofore known auto-zeroing technique exhibits an undesireably large power consumption, with all its attendant disadvantages.

SUMMARY OF THE INVENTION

It is accordingly the principal object of the present invention to provide an auto-zeroed sampling circuit that exhibits a higher speed and a lower power consumption than that heretofore achieved. In accord therewith, first means coupled between both the D.C. and the A.C. input signals and the input capacitor are disclosed for sampling the D.C. reference onto, while isolating the A.C. signal from, the input capacitor at a first, comparatively-low frequency. Second means, cooperative with the first means, are disclosed for enabling auto-zeroing of the comparator contemporaneously with the sampling at the first, comparatively-low frequency onto the input capacitor. Third means cooperative with the first and second means are disclosed for latching the A.C. input signal at a second, comparatively-high frequency in the data latch. Fourth means cooperative with the second and the third means are disclosed for inhibiting the latching means at the second, comparatively-high frequency while the auto-zeroing means is operative at the first comparatively-low frequency. The second, comparatively-high frequency is preferably selected to be from about ten (10) to the hundreds of megahertz, while the first, comparatively-low frequency is preferably selected to be on the order of a kilohertz.

In as much as the latching means is a high-speed device that is able to be operated at any selected second, comparatively-high frequency of practicable interest except when it is inhibited during auto-zeroing at the first, comparatively-low frequency, the instant invention enables to provide a higher-speed of operation than that allowed by the heretofore known auto-zeroed comparator technique that was limited by the time constants that came in play as the input capacitor was auto-zeroed cycle-to-cycle. In as much as the differential in rates between the second, comparatively-high frequency and the first, comparatively-low frequency enables to achieve a large number of samples before an auto-zeroing cycle is performed, switching transients are reduced at the input capacitor, further enabling to provide a higher-speed of operation than heretofore possible.

Since the auto-zeroing is performed at the first, comparatively-low frequency, and because power dissipation largely occurs during auto-zeroing, power dissipation actually decreases while sampling rate increases in comparison to devices constructed in accord with the heretofore known technique.

BRIEF DESCRIPTION OF THE DRAWINGS

Other objects, features, and aspects of the present invention will become apparent as the invention becomes better understood by referring to the following detailed description of the preferred embodiment thereof, and to the drawings, wherein.

DETAILED DESCRIPTION OF THE PREFERRED EMBODIMENT

Figure 1:
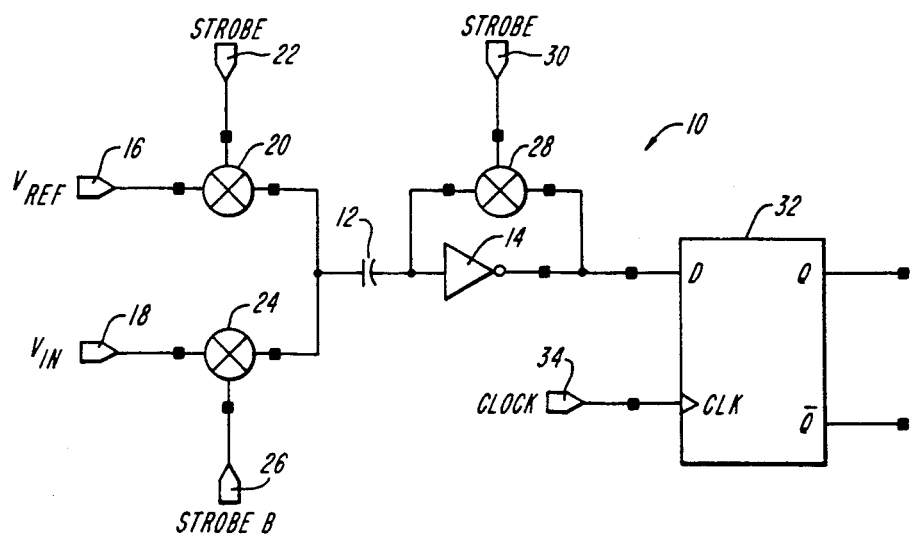
FIG. 1 is a schematic diagram of the high-speed, low-power, auto-zeroed sampling circuit in accord with the present invention.

Referring now to FIG. 1, general)y designated at 10 is a circuit diagram of the novel high-speed, low-power auto-zeroed sampling circuit in accord with the present invention. The circuit 10 includes a coupling capacitor 12 connected in series to a circuit element that is subjected to output offset error, such as an analog inverter 14, and connected in parallel to a terminal 16 marked "$V_{REF}$" at which an input D.C. signal is impressed along a D.C. input signal path to the capacitor 12, and to a terminal 18 marked "$V_{IN}$", at which an A.C. input signal is impressed along an A.C. input signal path to the capacitor 12. A switch 20 is serially connected along the D.C input signal path that is caused to switch between its "on" and "off" conditions by a clocking signal marked "strobe" applied to a terminal 22, and a switch 24 is serially connected in the A.C. input signal path that is caused to controllably assume its "on" an its "off" conditions in response to a clocking signal marked "strobe B" applied to terminal 26. A switch 28 is coupled in a feedback loop between the output of the inverter 14 and the input thereof, which is caused to controllably assume its "off" and its "on" conditions by a clock marked "strobe" applied to terminal 30 thereof. The input capacitor capacitance is selected to be large enough to maintain charge impressed thereto by the input D.C. reference signal stably over the period of the "strobe" clocking signal. The switches 20, 24 and 28 may be of any suitable switch, such as complementary or single polarity MOSFET's, the analog inverter may be a single-input, single-output device, as illustrated, or a single-input, double-output, or a double-input, single-output, or a double-input, double-output, comparator, or operational amplifier or other device without departing from the inventive concept.

A latch 32 having a "D" input is connected with its "D" input in electrical series relation with the output of the inverter 14. The latch 32 is clocked by a clocking signal marked "clock" applied to terminal 34 thereof connected to its clock (CLK) input. The latch 32 has outputs marked "Q" and "$\bar{Q}$".

Figure 2:
FIG. 2 is a timing diagram useful in explaining the operation of the high-speed, low-power auto-zeroed sampling circuit of FIG. 1.
Figure 2:
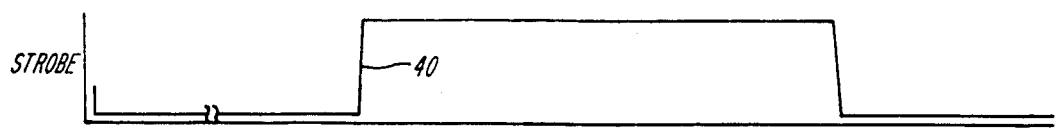
Figure 2:

As shown in FIG. 2, the strobe and the strobe B clocking signals are in phase-opposed time-overlapping relation as illustrated by waveforms 40, 42. The strobe and the strobe B waveforms 40, 42 have complementary duty cycles selected from the range of a minimum of one period of the comparatively-high frequency clock to any other multiple thereof, and preferably one of the strobe and strobe B waveforms 40, 42 is provided having a 0.001 percent duty cycle. They, preferably, are at frequencies selected to be in the kilohertz range. A waveform 44 illustrates the clock signal. It preferably is at a frequency selected to be from a megahertz to hundreds of megahertz, one hundred twenty five (125) megahertz in the exemplary embodiment, and preferably has a fifty (50) percent duty cycle. The waveforms 40, 42 have a comparatively-low frequency and complementary duty cycles, and the clock waveform 44 has a comparatively-high frequency. As shown, the clock signal 44 is inhibited when the strobe waveform 40 is "high" cycle-to-cycle.

In operation, auto-zeroing is accomplished while the strobe waveform 40 is "high" such that the D.C. input signal is applied from the terminal 16 to one side of the coupling capacitor 12 while the output of the inverter 14 is coupled back to the other side of the coupling capacitor 12. The offset voltage produced by the inverter 14 is thereby subtracted at the capacitor 12 from the D.C. input signal, providing auto-zeroing thereof. During this time, the clock waveform 44 is disabled, and no data is latched in the data latch 32. The strobe B waveform 42 is "high" at all times except when the strobe waveform is "high", at which time it is "low", preventing the impression of the A.C. input signal to the coupling capacitor 12 during the auto-zeroing cycle. At all other times, the strobe B clocking signal 42 is "high", which holds the switch 24 in its "on" condition, whereby the A.C. input signal impressed to the terminal 18 is capacitively coupled through the capacitor 12 to the inverter 14. During such times, the clock applied to the terminal 34 of the latch 32 enables to latch, at the cock frequency, the comparison of the A.C. input signal to the D.C. reference voltage.

Since power consumption is greatest during the auto-zeroing cycle established by the duty cycle of the waveform 40, power consumption is minimized by the present invention, in as much as auto-zeroing occurs only with the "high" condition of the strobe waveform 40, which occurs at a comparatively-low frequency and duty cycle.

Since the latch 32 is able to be clocked as quickly a is desirable in any practicable environment, due to its ability to be clocked at any speed of practicable interest, and because the clocking of the latch 32 occurs only when the strobe signal is not "high", the instant invention enables to provide high-speed sampling in a manner that is substantially free from the charging constraints imposed on charging the capacitor cycle-to-cycle as in the heretofore known auto-zeroing techniques.

Since auto-zeroing occurs at the comparatively-low frequency of the strobe clock 40, while sampling proceeds at the comparatively high-frequency of the clock 44, the present invention is free from the production of transients that would otherwise arrive during auto-zeroing at the high-frequency clocking rate of the heretofore known auto-zeroing technique cycle-to-cycle.

Many modifications of the presently disclosed invention will become apparent to those skilled in the art having benefitted from the instant disclosure.

What is claimed is:

1. A high-speed, low-power, auto-zeroed sampling circuit, comprising:
   a circuit element having an input terminal and an output terminal that is subjected to output offset error;
   a capacitor having a first terminal and a second terminal with the first capacitor terminal coupled to the circuit element input terminal;
   a first switch having an input port, an output port and a clock signal port, wherein the output port of said first switch is coupled to the second terminal of the capacitor and said first switch is adapted to receive, on the clock signal port, a first auto-zeroing clock signal having a first frequency and a first duty cycle wherein the auto-zeroing clock signal causes said first switch to switch between a conductive state and a nonconductive state at the first frequency and wherein said first switch, in its conductive state, couples a DC reference potential to the second terminal of said capacitor and said first switch in its nonconductive state isolates said DC reference potential from said capacitor;
   a second switch having an input port and an output port and a clock signal port, wherein the output port of said second switch is coupled to the second terminal of the capacitor and wherein said second switch is adapted to receive, on the clock signal port, a second auto-zeroing clock signal having said first frequency and a second duty cycle, wherein the second auto-zeroing clock signal causes said second switch to switch between a conductive state and a nonconductive state at the first frequency, and wherein the second switch, in its conductive state, couples an AC input signal to the second terminal of said capacitor and the second switch in its nonconductive state isolates the AC input signal from the second terminal of said capacitor and wherein when the first switch is in its conductive state, the second switch is in its nonconductive state;
   a third switch having an input port and an output port, wherein the input port of said third switch is coupled to the output terminal of the circuit element and the output port of said third switch is coupled to the input terminal of the circuit element to provide a feedback loop between the input terminal and output terminal of said circuit element and wherein said third switch is caused to toggle between its conductive and nonconductive states by said first auto-zeroing clock signal; and
   a data latch having an input port and a sampling control port, wherein the input port of the data latch is coupled to the output terminal of the circuit element and said data latch is adapted to receive, at the sampling control port, a sampling clock signal having a second frequency wherein said second frequency is higher than the frequency of said first and second auto-zeroing clock signals, and wherein said sampling clock signal causes an output signal at the output terminal of the circuit element to be sampled into the input port of the data latch, wherein said sampling clock signal is inhibited when said first switch is in its conductive state.

2. The invention of claim 1, wherein said circuit element comprises an inverter.

3. The invention of claim 2, wherein said inverter is an analog inverter.

4. The invention of claim 1, wherein the capacitor has a preselected capacitance selected to stably hold applied potential over the period of the second auto-zeroing clock signal.

5. The invention of claim 14, wherein the frequency of the first and second auto-zeroing clock signals is in the kilohertz range and the sampling clock signal frequency is in the range from one to hundreds of megahertz.

6. The invention of claim 5, wherein the duty cycle of a first one of said first and second auto-zeroing clock signals is selected from a range of from a minimum period equaling a period of said sampling clock signal to a multiple thereof and the duty cycle of a second one of said first and second auto-zeroing clock signals is selected to complement the duty cycle of the first one of the first and second auto-zeroing clock signals.

7. The invention of claim 1, wherein said circuit element is a single-input, single-output circuit element.

8. The invention of claim 7, wherein the single-input, single-output circuit element is an analog inverter.

9. The invention of claim 1, wherein:
   the duty cycle of the first auto-zeroing clock signal is higher than the duty cycle of the second auto-zeroing clock signal; and
   the first and second auto-zeroing clock signals are provided as phase-opposed and time-overlapping signals.

10. A high-speed low-power sampling circuit enabling an input D.C. reference signal and an input A.C. signal to be applied respectively over electrically-parallel circuit paths to a circuit element input whose output is connected to a data latch, comprising:
    an input capacitor in series with the parallel circuit paths and the circuit element input;
    first means, coupled between both the D.C. and the A.C. electrically-parallel circuit paths and the input capacitor, for sampling, at a first frequency, the input D.C. reference signal onto the input capacitor while isolating the A.C. signal from the input capacitor;
    second means, cooperative with the first means, for enabling auto-zeroing of the circuit element contemporaneously with the sampling at the first frequency onto the input capacitor and for providing feedback between the output and input of the circuit element;
    third means, coupled to said data latch, for latching the output of the circuit element at a second frequency in the data latch wherein said second frequency is higher than said first frequency; and
    wherein the means for latching at the second frequency is inhibited while the second means is operative at the first frequency.

11. The invention of claim 10, wherein said first means includes first and second switches respectively in series with one of the electrically-parallel circuit paths that are clocked at the rate of the first frequency.

12. The invention of claim 11, wherein said first and second switches are clocked in time-overlapping phase-opposition.

13. The invention of claim 11, wherein said second means includes a third switch in a feedback loop extending between the input and output of the circuit element, wherein said third switch is clocked at the first frequency.

14. The invention of claim 13, wherein the first frequency is selected to be in the kilohertz range and the second frequency is selected to be in the range from a megahertz to hundreds of megahertz.

* * * * *